(12) United States Patent
Morikazu

(10) Patent No.: US 7,355,157 B2
(45) Date of Patent: Apr. 8, 2008

(54) LASER BEAM PROCESSING MACHINE EMPLOYING TWO BEAM SPOTS HAVING ARCUATE PORTIONS FOR FORMING A SUBSTANTIALLY RECTANGULAR COMBINED SPOT

(75) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/372,210

(22) Filed: Mar. 10, 2006

(65) Prior Publication Data

US 2006/0208167 A1 Sep. 21, 2006

(30) Foreign Application Priority Data

Mar. 15, 2005 (JP) ............................. 2005-073262

(51) Int. Cl.
*H01L 27/00* (2006.01)
(52) U.S. Cl. .................................. 250/208.1; 250/548
(58) Field of Classification Search ............ 250/208.1, 250/548, 559.3, 559.4, 201.3, 306, 307; 356/399–401; 355/53, 55
See application file for complete search history.

(56) References Cited

U.S. PATENT DOCUMENTS 5,662,410 A * 9/1997 Suganuma .................. 362/268
6,580,054 B1 6/2003 Liu et al.
6,960,739 B2 11/2005 Liu et al.
2003/0226832 A1 12/2003 Liu et al.
2006/0148210 A1* 7/2006 Furuta et al. ............... 438/460

FOREIGN PATENT DOCUMENTS

JP 10-305420 11/1998
JP 2004-9139 1/2004

* cited by examiner

*Primary Examiner*—Que T Le
(74) *Attorney, Agent, or Firm*—Smith, Gambrell & Russell, LLP

(57) ABSTRACT

Disclosed herein is a beam processing machine comprising laser beam application device for applying a laser beam to a workpiece, which device includes a laser beam oscillator and a condenser for converging a laser beam to apply the converged laser beam. The condenser includes a first prism for splitting the laser beam oscillated from the laser beam oscillator into a first laser beam and a second laser beam both having a semicircular section and interchanging the first laser beam with the second laser beam, a second prism for correcting the optical paths of the first laser beam and the second laser beam split by the first prism to become parallel to each other, and an image forming lens for focusing the first laser beam and the second laser beam whose optical paths have been corrected by the second prism to become parallel to each other into spots having linear portions on the outer side and arcuate portions on the inner side. The image forming lens partially overlaps the arcuate portions of the spots of the first laser beam and the second laser beam with each other to form a rectangular spot.

4 Claims, 8 Drawing Sheets

(a)

(b)

LASER BEAM PROCESSING MACHINE EMPLOYING TWO BEAM SPOTS HAVING ARCUATE PORTIONS FOR FORMING A SUBSTANTIALLY RECTANGULAR COMBINED SPOT

FIELD OF THE INVENTION

The present invention relates to a laser beam processing machine for forming a groove along a predetermined dividing line on a wafer such as an optical device wafer or the like.

DESCRIPTION OF THE PRIOR ART

An optical device wafer comprising optical devices, which are composed of a gallium nitride-based compound semiconductor layer or the like that is laminated in each of a plurality of areas sectioned by dividing lines formed in a lattice pattern on the front surface of a sapphire substrate and the like is divided along the dividing lines into individual optical devices such as light emitting diodes or laser diodes which are widely used in electric appliances.

Cutting along the dividing lines of a wafer such as the above optical device wafer is generally carried out by using a cutting machine for cutting it by rotating a cutting blade at a high speed. However, as the sapphire substrate has such a high Moh's hardness that it is difficult to be cut, the processing speed must be slowed down, there by reducing productivity.

Meanwhile, as a means of dividing a plate-like workpiece such as a wafer, JP-A 10-305420 discloses a method comprising applying a pulse laser beam along dividing lines formed on a workpiece to form grooves and dividing to cut the workpiece along the laser-processed grooves by a mechanical breaking apparatus.

JP-A 2004-9139 discloses a method comprising applying a pulse laser beam having absorptivity for a sapphire substrate to the substrate to form grooves.

The laser beam to be applied to form the above grooves goes straight even when it is hit against a substance which absorbs it. Therefore, even when a laser beam having absorptivity for a substrate constituting the wafer is applied to the substrate, all the energy of the laser beam is not absorbed by the substrate and the unabsorbed laser beam goes to the side opposite to the incident side of the wafer. When a groove is to be formed on an optical device wafer having a plurality of optical devices on the front surface of a sapphire substrate or the like, a laser beam is applied from the back surface side of the wafer so as to prevent damage caused by the adhesion of debris produced at the time of laser processing to an optical device formed on the front surface of the substrate. Meanwhile, the energy of the laser beam shows a Gaussian distribution that it is strong at the center and becomes weaker toward the outer sides. However, as described above, when the laser beam not absorbed by the substrate, especially the laser beam having relatively low energy which is on the outer sides of the Gaussian distribution and does not contribute to processing reaches the front surface of the substrate, it damages a device layer formed on the front surface of the substrate, thereby reducing the quality of the optical device.

SUMMARY OF THE INVENTION

It is an object of the present invention to provide a laser beam processing machine which can form a groove along dividing lines on the back surface of a wafer without damaging the front surface of the wafer by applying a laser beam to the back surface of the wafer along a predetermined dividing line.

To attain the above object, according to the present invention, there is provided a laser beam processing machine comprising a chuck table for holding a workpiece, a laser beam application means for applying a laser beam to the workpiece held on the chuck table, and a processing-feed means for moving the chuck table and the laser beam application means relative to each other, the laser beam application means comprising a laser beam oscillation means and a condenser for converging a laser beam oscillated from the laser beam oscillation means to apply the converged laser beam, wherein the condenser comprises a first prism for splitting the laser beam oscillated from the laser beam oscillation means into a first laser beam and a second laser beam both having a semicircular section and interchanging the first laser beam with the second laser beam, a second prism for correcting the optical paths of the first laser beam and the second laser beam split by the first prism to become parallel to each other, and an image forming lens for focusing the first laser beam and the second laser beam whose optical paths have been corrected by the second prism to become parallel to each other into spots having linear portions on the outer side and arcuate portions on the inner side; and the image forming lens partially overlaps the arcuate portions of the spots of the first laser beam and the second laser beam with each other to form a rectangular spot.

The interval between the spots of the first laser beam and the second laser beam focused by the image forming lens is controlled by adjusting the interval between the first prism and the second prism. A cylindrical lens is arranged on the upstream side in the laser beam application direction of the first prism or on the downstream side in the laser beam application direction of the second prism.

In the laser beam processing machine according to the present invention, the linear portions of the image forming spots of the first laser beam and the second laser beam for forming a groove are located on the outer side and the arcuate portions of the spots are located on the inner side and partially overlapped with each other to form a rectangular spot. Therefore, a portion having relatively low energy on the outer sides of the Gaussian distribution of the laser beam is located on the inner side and a portion having high energy on the center portion of the Gaussian distribution of the laser beam is located on the outer side. Consequently, the groove can be formed with the outermost sides of the image forming spots of the first laser beam and the second laser beam, whereby the laser beam does not exceed the width of the groove. Therefore, a device formed on the front surface of the workpiece is not damaged by the energy of the laser beam when the groove is formed by applying the laser beam from the back surface side of the workpiece.

DETAILED DESCRIPTION OF THE PREFERRED EMBODIMENTS

Preferred embodiments of a laser beam processing machine constituted according to the present invention will be described in detail hereinunder with reference to the accompanying drawings.

Figure 1:
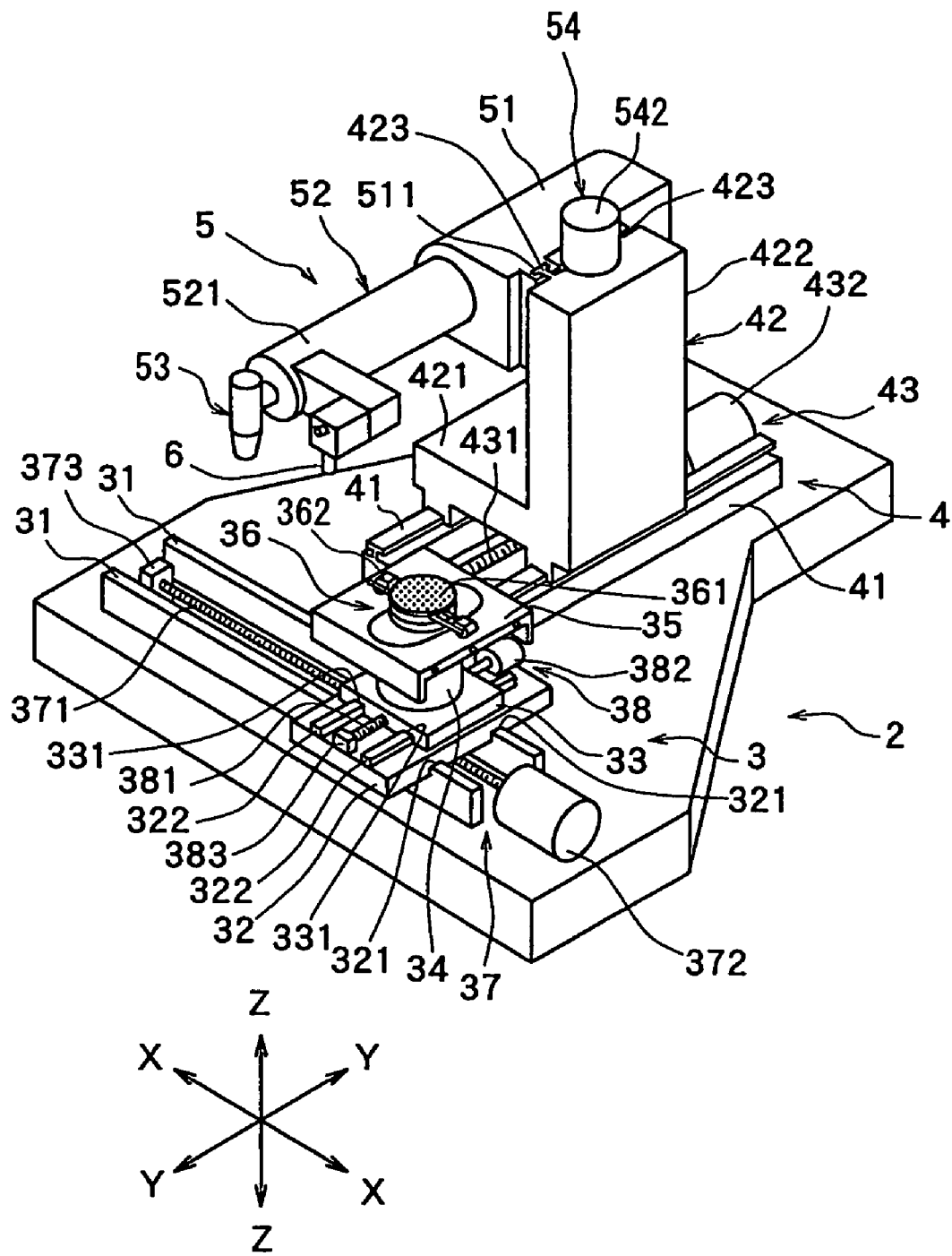
FIG. 1 is a perspective view of a laser beam processing machine constituted according to the present invention.

FIG. 1 is a perspective view of a laser beam processing machine constituted according to the present invention. The laser beam processing machine shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the direction indicated by the arrow X, and a laser beam application unit 5 mounted on the laser beam application unit support mechanism 4 in such a manner that it can move in a focal position adjustment direction indicated by an arrow Z.

The above chuck table mechanism 3 comprises a pair of guide rails 31 and 31, which are mounted on the stationary base 2 and arranged parallel to each other in the direction indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the direction indicated by the arrow Y, a support table 35 supported on the second sliding block 33 by a cylindrical member 34, and a chuck table 36 as workpiece holding means. This chuck table 36 is made of a porous material and has a workpiece holding surface 361, and a plate-like workpiece, for example, disk-like semiconductor wafer is held on the chuck table 36 by a suction means that is not shown. The chuck table 36 is rotated by a pulse motor (not shown) installed in the cylindrical member 34. The chuck table 36 is provided with clamps 362 for fixing an annular frame for supporting a semiconductor wafer which will be described later.

The above first sliding block 32 has, on its undersurface, a pair of to-be-guided grooves 321 and 321 to be fitted to the above pair of guide rails 31 and 31 and, on its top surface, a pair of guide rails 322 and 322 formed parallel to each other in the direction indicated by the arrow Y. The first sliding block 32 constituted as described above can move in the direction indicated by the arrow X along the pair of guide rails 31 and 31 by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the direction indicated by the arrow X. The processing-feed means 37 comprises a male screw rod 371 arranged between the above pair of guide rails 31 and 31 parallel thereto, and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372 via a speed reducer that is not shown. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on its undersurface, a pair of to-be-guided grooves 331 and 331 to be fitted to the pair of guide rails 322 and 322 on the top surface of the above first sliding block 32 and can move in the direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 in the direction indicated by the arrow Y along the pair of guide rails 322 and 322 on the first sliding block 32. The first indexing-feed means 38 comprises a male screw rod 381 which is arranged between the above pair of guide rails 322 and 322 parallel thereto, and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382 via a speed reducer that is not shown. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41, which are mounted on the stationary base 2 and arranged parallel to each other in the direction indicated by the arrow Y and a moveable support base 42 mounted on the guide rails 41 and 41 in such a manner that it can move in the direction indicated by the arrow Y. This movable support base 42 comprises a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the direction indicated by the arrow Y. This second indexing-feed means 43 comprises a male screw rod 431 arranged between the above pair of guide rails 41 and 41 parallel thereto, and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432 via a speed reducer that is not shown. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively.

Figure 2:
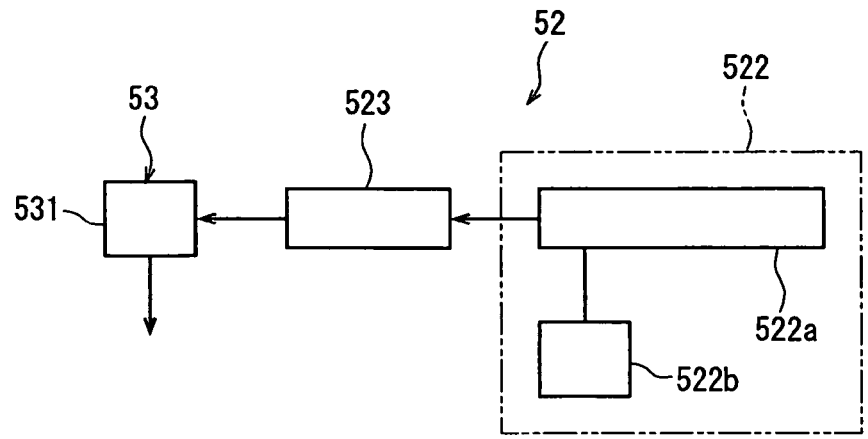
FIG. 2 is a block diagram schematically showing the constitution of laser beam application means provided in the laser beam processing machine shown in FIG. 1.

The illustrated laser beam application means 52 comprises a cylindrical casing 521 that is secured to the above unit holder 51 and extends substantially horizontally. In the casing 521, there are installed a pulse laser beam oscillation means 522 and a transmission optical system 523, as shown in FIG. 2. The pulse laser beam oscillation means 522 comprises a pulse laser beam oscillator 522a composed of a YAG laser oscillator or YVO4 laser oscillator and a repetition frequency setting means 522b connected to the pulse laser beam oscillator 522a. The transmission optical system 523 comprises suitable optical elements such as a beam splitter, etc. A condenser 53 for converging a laser beam oscillated from the above laser beam oscillation means 522 and transmitted via the optical transmission system 523, is attached to the end of the above casing 521.

A first embodiment of the condenser 53 will be described with reference to FIG. 3.

Figure 3:
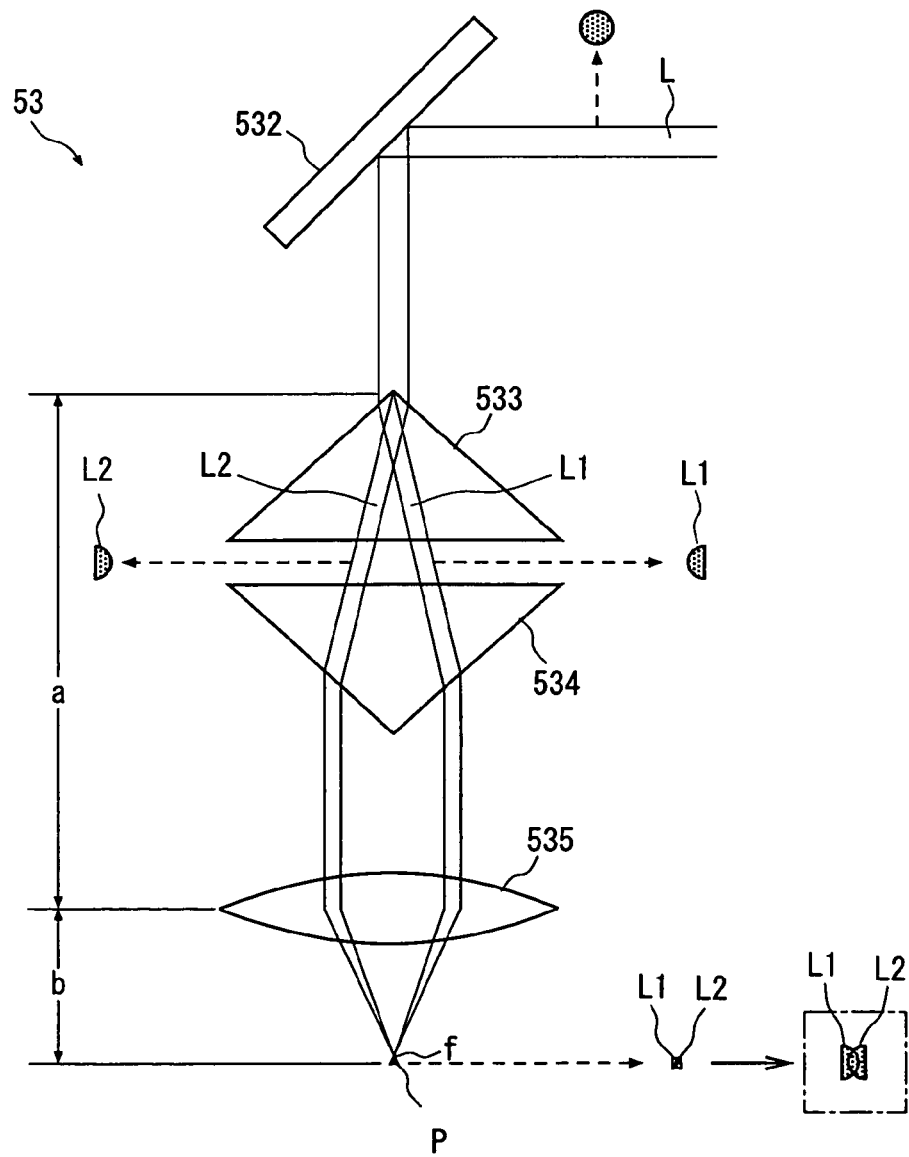
FIG. 3 is an explanatory diagram showing a first embodiment of the condenser provided in the laser beam processing machine shown in FIG. 1.

The condenser 53 shown in FIG. 3 comprises a direction changing mirror 532, a first prism 533, a second prism 534 and an image forming lens 535 all of which are installed in a case 531 (see FIG. 2). The direction changing mirror 532 changes the direction of a laser beam L that is oscillated from the above pulse laser beam oscillation means 522 (see FIG. 2) and irradiated via the transmission optical system 523, to a downward direction, that is, toward the first prism 533, as shown in FIG. 3. The first prism 533 splits the laser beam L oscillated from the pulse laser beam oscillation means 522 into a first laser beam L1 and a second laser beam L2 both having a semicircular section and interchanges the first laser beam L1 with the second laser beam L2. The second prism 534 corrects the optical paths of the first laser beam L1 and the second laser beam L2 split by the first prism 533 to become parallel to each other. The image forming lens 535 focuses the first laser beam L1 and the second laser beam L2 whose optical paths have been corrected by the second prism 534 into spots.

The condenser 53 shown in FIG. 3 is constituted as described above, and its function will be described hereinunder. The direction of the laser beam L having a circular section, which has been oscillated from the above pulse laser beam oscillation means 522 and is illuminated through the transmission optical system 523 is changed to a direction toward the first prism 533 by the direction changing mirror 532. The laser beam L having a circular section, which has reached the first prism 533, is split into the first laser beam L1 and the second laser beam L2 both having a semicircular section by the first prism 533, and the first laser beam L1 and the second laser beam L2 are interchanged by the first prism 533. As a result, arcuate portions of the first laser beam L1 and the second laser beam L2 are located on the inner side and linear portions are located on the outer side, respectively. The optical paths of the first laser beam L1 and the second laser beam L2 thus split are then corrected to become parallel to each other after they pass through the second prism 534. The first laser beam L1 and the second laser beam L2 whose optical paths have been corrected to become parallel to each other by the second prism 534 are focused at a predetermined image forming position "P" after they pass through the image forming lens 535. Since the image forming position "P" is located on the downstream side of the focal point "f" of the image forming lens 535 at this point, the first laser beam L1 and the second laser beam L2 are inverted and focused into spots having linear portions on the outer side and arcuate portions on the inner side. It is important that the arcuate portions of the spots of the first laser beam L1 and the second laser beam L2 focused by this image forming lens 535 should be partially overlapped with each other to form a rectangular spot.

In the above embodiment, the image forming spots at the image forming position "P" on the downstream side of the focal point "f" of the image forming lens 535 are used. Spots at a distance of ±100 μm from the focal point "f" can be used for laser processing.

Figure 4:
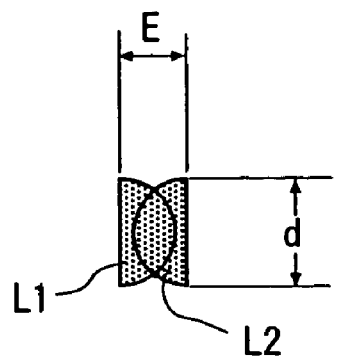
FIG. 4 is an enlarged view of configuration of a first laser beam spot and a second laser beam spot focused by the condenser shown in FIG. 3.
Figure 5:
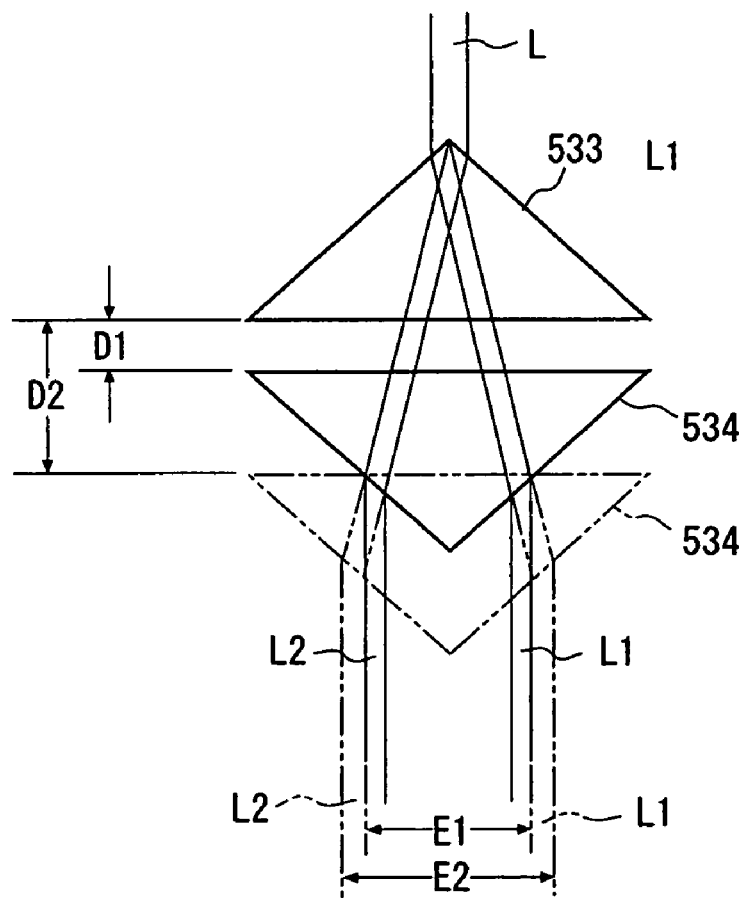
FIG. 5 is an explanatory showing a state where the interval between the first laser beam spot and the second laser beam spot is changed by altering the interval between a first prism and a second prism constituting the condenser shown in FIG. 3.

When the distance between the apex of the first prism 533 and the image forming lens 535 is represented by "a", the distance between the image forming lens 535 and the image forming position "P" is represented by "b" and the focal distance of the image forming lens 535 is represented by "f" in FIG. 3, the equation (1/a+1/b=1/f) is established. As shown in FIG. 4, the diameter "d" (length) of the spots of the first laser beam L1 and the second laser beam L2 both having semicircular shape is determined by magnification (m=b/a). The width "E" made by the spots of the first laser beam L1 and the second laser beam L2 is changed by varying the interval between the first prism 533 and the second prism 534. That is, as shown in FIG. 5, when the interval between the first prism 533 and the second prism 534 is "D1", the width (E) is "E1" between the first laser beam L1 and the second laser beam L2 passing through the second prism 534. When the interval between the first prism 533 and the second prism 534 expands to "D2", the width (E) is "E2" between the first laser beam L1 and the second laser beam L2 passing through the second prism 534. Therefore, the width (E) of the spots of the first laser beam L1 and the second laser beam L2 focused at the predetermined image forming position "P" (see FIG. 3) after they pass through the image forming lens 535 also changes. For instance, when the diameter of the laser beam L entered to the first prism 533 is 1 mm, the magnification "m" is 1/50, and the interval "D" between the first prism 533 and the second prism 534 is changed from 1 mm to 5 mm, the width (E) of the spots of the first laser beam L1 and the second laser beam L2 changes in a range from 5 to 20 µm.

A description will be subsequently given of a second embodiment of the condenser 53 with reference to FIG. 6.

Figure 6:
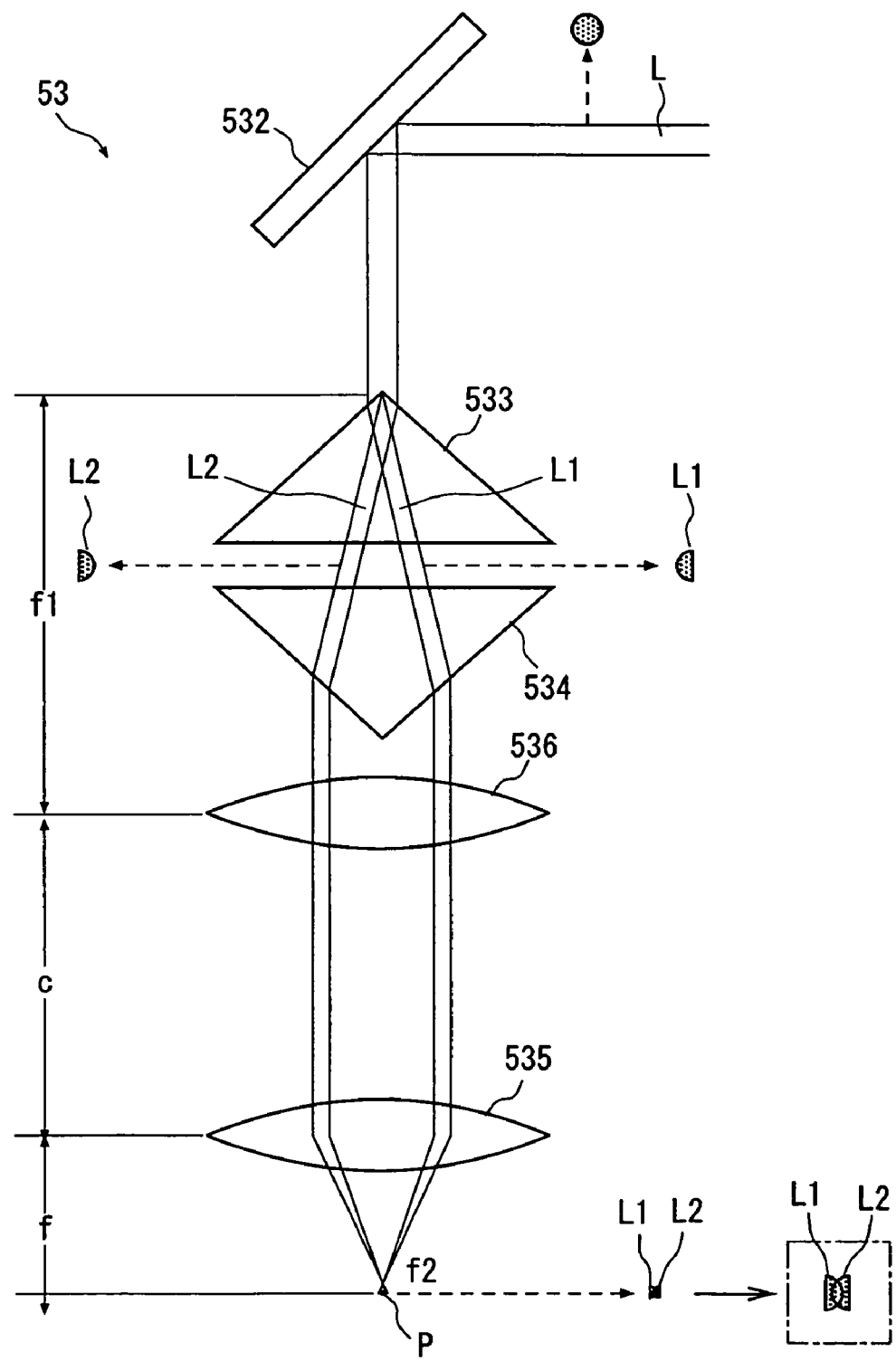
FIG. 6 is an explanatory of a second embodiment of the condenser provided in the laser beam processing machine shown in FIG. 1.

In the condenser 53 shown in FIG. 6, a relay lens 536 is interposed between the second prism 534 and the image forming lens 535 in the first embodiment shown in FIG. 3. Since other constituent members of the condenser 53 shown in FIG. 6 are the same as the constituent members of the first embodiment shown in FIG. 3, the same members are given the same reference symbols and their descriptions are omitted.

In the condenser 53 shown in FIG. 6, the back-focus position "f1" of the relay lens 536 is aligned with the apex position of the first prism 533 to form an infinite correction optical system. Therefore, as the interval "c" between the relay lens 536 and the image forming lens 535 can be freely changed, the degree of design freedom is high. In the condenser 53 shown in FIG. 6, the magnification can be freely changed by a combination of the relay lens 536 and the image forming lens 535. In the condenser 53 shown in FIG. 6, the image forming position "P" of the first laser beam L1 and the second laser beam L2 becomes the focal point "f" of the image forming lens 535. "f2" in FIG. 6 is the focal point obtained by a combination of the relay lens 536 and the image forming lens 535. It is also important in this embodiment that the linear portions of the spots of the first laser beam L1 and the second laser beam L2 having a semicircular section focused by the image forming lens 535 should be located on the outer side and the arcuate portions should be located on the inner side and partially overlapped with each other to form a rectangular spot.

A description will be subsequently given of a third embodiment of the condenser 53 with reference to FIG. 7.

Figure 7:
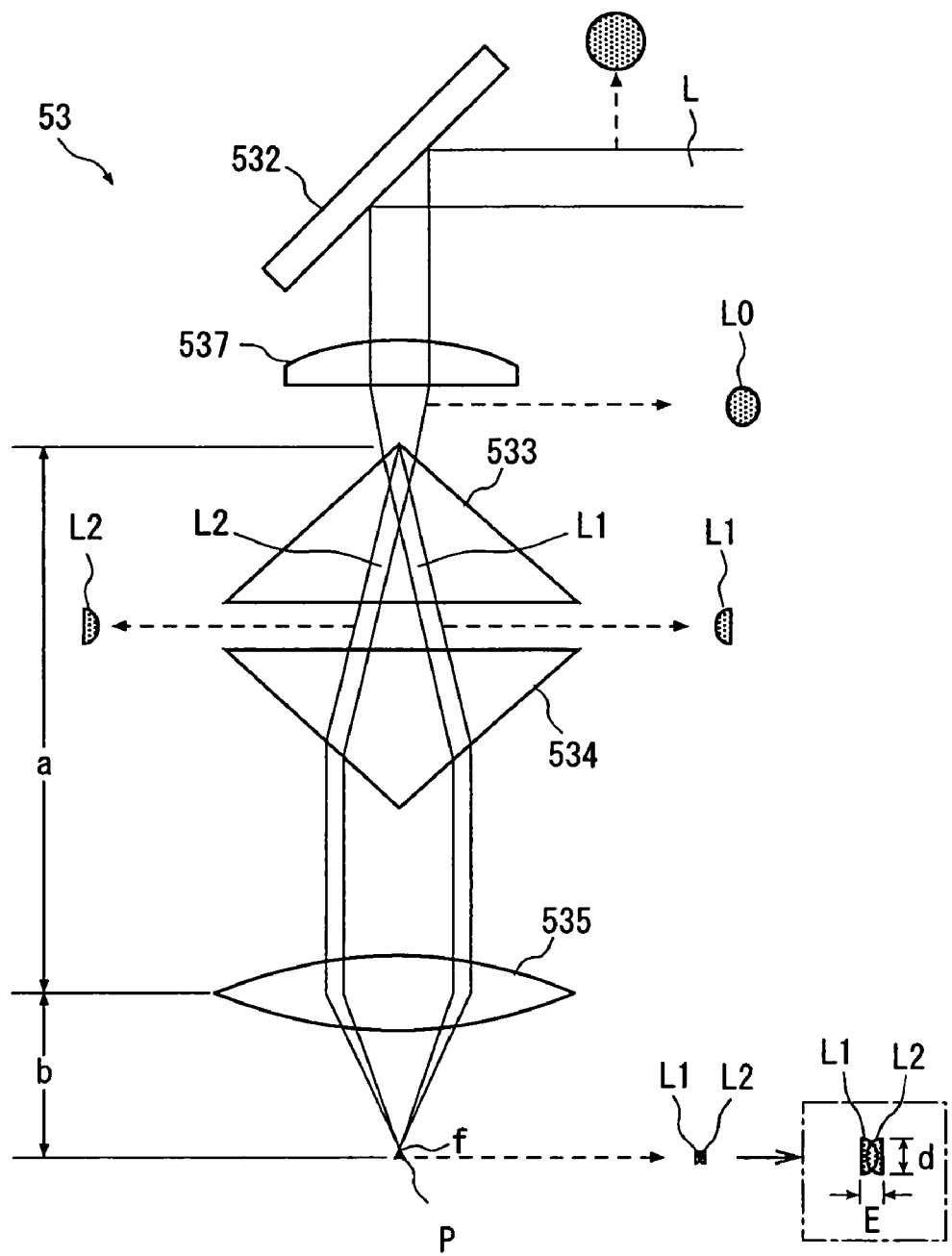
FIG. 7 is an explanatory of a third embodiment of the condenser provided in the laser beam processing machine shown in FIG. 1.

In the condenser 53 shown in FIG. 7, a cylindrical lens 537 is arranged on the upstream side in the laser beam application direction of the first prism 533 in the first embodiment shown in FIG. 3, that is, between the direction changing mirror 532 and the first prism 533. Since other constituent members of the condenser 53 shown in FIG. 7 are the same as the constituent members of the first embodiment shown in FIG. 3, the same members are given the same reference symbols and their descriptions are omitted.

In the condenser 53 shown in FIG. 7, after the laser beam L having a circular section, which has been oscillated from the above pulse laser beam oscillation means 522 and is illuminated through the transmission optical system 523 passes through the cylindrical lens 537, it reaches the first prism 533 as a laser beam having an elliptic section. As a result, a first laser beam L1 and a second laser beam L2 split by the first prism 533 have a semi-elliptic section, and the image forming spots of the first laser beam L1 and the second laser beam L2 passing through the second prism 534 and focused by the image forming lens 535 become semi-elliptic as well. Also in this embodiment, the arcuate portions of the spots of the first laser beam L1 and the second laser beam L2 focused by the image forming lens 535 are partially overlapped with each other to form a rectangular spot. Thus, the rectangular spot is formed by making the sections of the image forming spots of the first laser beam L1 and the second laser beam L2 semi-elliptic and partially overlapping the arcuate portions of the spots with each other, thereby making it possible to increase the ratio of the length "d" to the width "E". Accordingly, since pulse laser beams are applied sequentially in the direction of the length of the image forming spots, the ratio of the overlapped portions of the image forming spots (pulses) can be increased and hence, a continuous groove 15 can be formed without fail.

A description will be subsequently given of a fourth embodiment of the condenser 53 with reference to FIG. 8.

Figure 8:
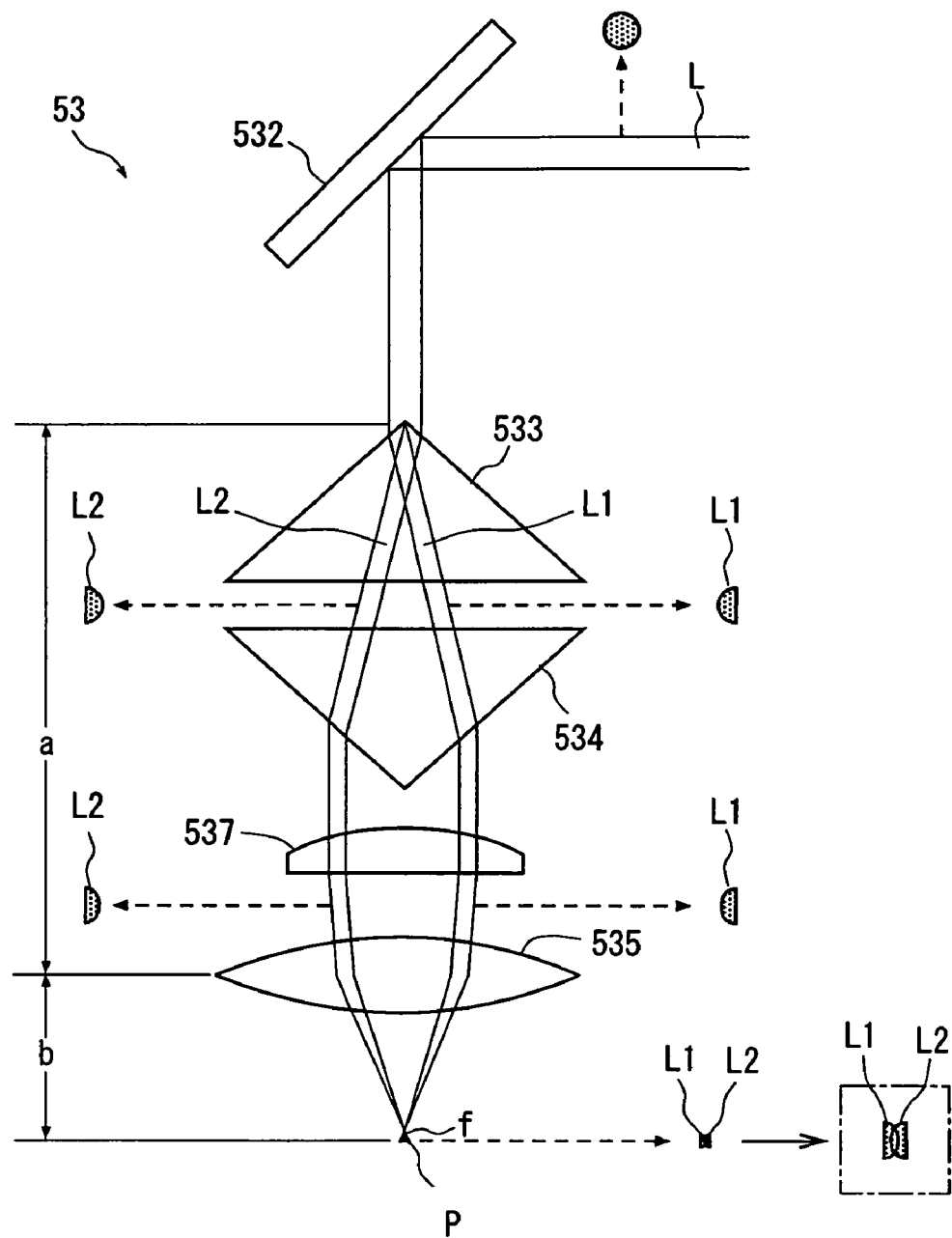
FIG. 8 is an explanatory of a fourth embodiment of the condenser provided in the laser beam processing machine shown in FIG. 1.

In the condenser 53 shown in FIG. 8, the cylindrical lens 537 in the third embodiment shown in FIG. 7 is arranged on the downstream side in the laser beam application direction of the second prism 534, that is, between the second prism 534 and the image forming lens 535. Since other constituent members of the condenser 53 shown in FIG. 8 are the same as the constituent members of the third embodiment shown in FIG. 7, the same members are given the same reference symbols and their descriptions are omitted.

In the condenser 53 shown in FIG. 8, the laser beam L having a circular section, which has been oscillated from the above pulse laser beam oscillation means 522 and is illuminated through the transmission optical system 523 is split into the first laser beam L1 and the second laser beam L2 both having a semicircular section by the first prism 533, and the first laser beam L1 and the second laser beam L2 are interchanged by the first prism 533. The optical paths of the first laser beam L1 and the second laser beam L2 are then corrected to become parallel to each other after they pass through the second prism 534. The first laser beam L1 and the second laser beam L2 whose optical paths have been corrected to become parallel to each other by the second prism 534 pass through the cylindrical lens 537, whereby their respective cross sections become semi-elliptic sections, and reach the image forming lens 535. After the first laser beam L1 and the second laser beam L2 pass through the image forming lens 535, the linear portions of the spots of the first laser beam L1 and the second laser beam L2 having a semi-elliptic section are located on the outer side and the arcuate portions of the spots are located on the inner side and partially overlapped with each other to form a rectangular spot.

In the above third embodiment and the fourth embodiment, the cylindrical lens 537 is provided to increase the ratio of the length "d" to the width "E" of the image forming spots of the first laser beam L1 and the second laser beam L2. The cylindrical lens 537 maybe dislocated at 90°. By dislocating the cylindrical lens 537 as described above, the ratio of the overlapped portions of the image forming spots of the first laser beam L1 and the second laser beam L2 can be increased.

Returning to FIG. 1, an image pick-up means 6 for detecting the area to be processed by the above laser beam application means 52 is mounted on the front end of the casing 521 constituting the above laser beam application means 52. This image pick-up means 6 comprises an infrared illuminating means for applying infrared radiation to the workpiece, an optical system for capturing the infrared radiation applied by the infrared illuminating means, and an image pick-up device (infrared CCD) for outputting an electric signal corresponding to the infrared radiation captured by the optical system, in addition to an ordinary image pick-up device (CCD) for picking up an image with visible radiation in the illustrated embodiment. An image signal is supplied to a control means that is not shown.

The laser beam application unit 5 in the illustrated embodiment comprises a moving means 54 for moving the unit holder 51 along the pair of guide rails 423 and 423 in the direction indicated by the arrow Z. The moving means 54 comprises a male screw rod (not shown) arranged between the pair of guide rails 423 and 423 and a drive source such as a pulse motor 542 for rotary-driving the male screw rod. By driving the male screw rod (not shown) in a normal direction or reverse direction with the pulse motor 542, the unit holder 51 and the laser beam application means 52 are moved along the guide rails 423 and 423 in the direction indicated by the arrow Z. In the illustrated embodiment, the laser beam application means 52 is moved up in a normal direction by driving the pulse motor 542 and moved down in a reverse direction by driving the pulse motor 542.

The laser beam processing machine in the illustrated embodiment is constituted as described above, and its function will be described hereinbelow.

Figure 9:
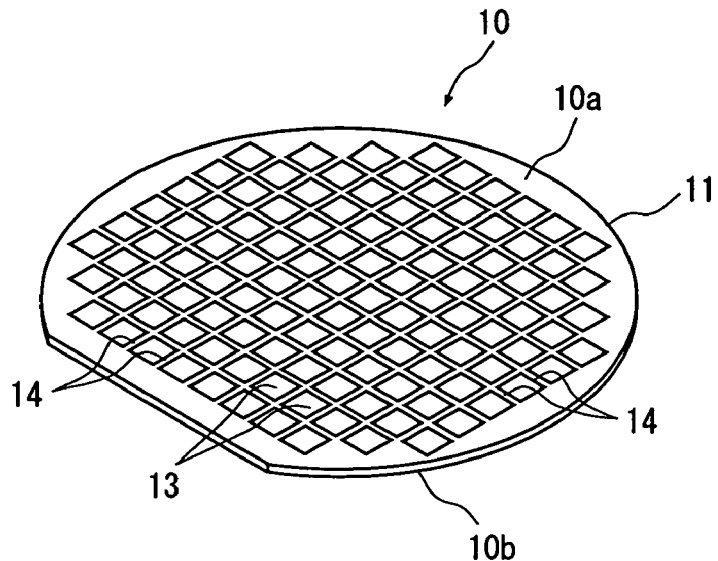
FIG. 9 is a perspective view of an optical device wafer as a workpiece.

An optical device wafer as a workpiece to be processed by the above laser beam processing machine will be described with reference to FIG. 9 and FIG. 10. FIG. 9 is a perspective view of the optical device wafer and FIG. 10 is an enlarged sectional view of the principal portion of the optical device wafer shown in FIG. 9.

Figure 10:
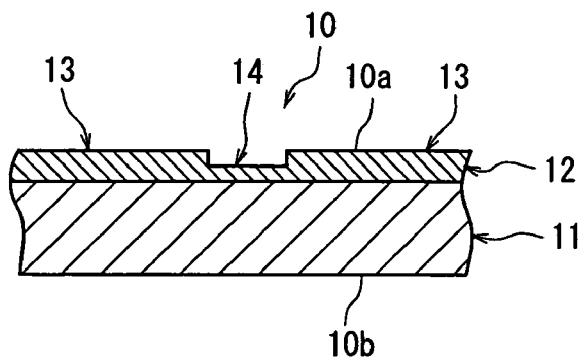
FIG. 10 is a partial enlarged sectional view of the optical device wafer shown in FIG. 9.

In the optical device wafer 10 shown in FIG. 9 and FIG. 10, a plurality of devices 13 composed of a device layer 12, in which layers formed from gallium nitride (GaN) or aluminum nitride gallium (AlGaN) or the like are laminated, are formed in a matrix on the front surface of a sapphire substrate 11. The devices 13 are sectioned by dividing lines 14 formed in a lattice pattern.

Figure 11:
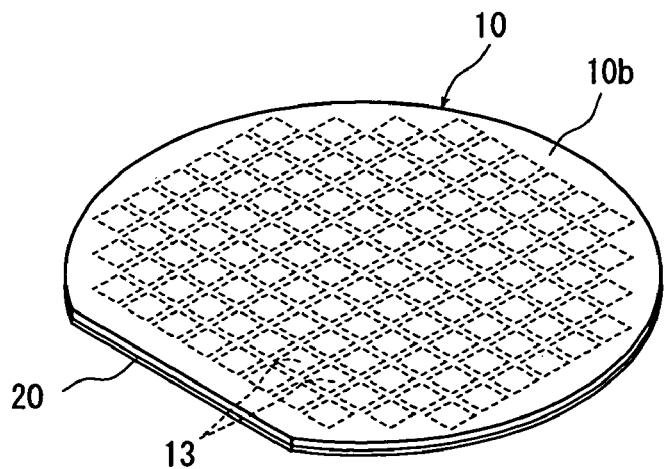
FIG. 11 is a perspective view showing a state where aprotective tape is affixed to the optical device wafer shown in FIG. 8.

For the laser processing of the back surface 10b of the optical device wafer 10 constituted as described above, a protective tape 20 is affixed to the front surface 10a of the optical device wafer 10, as shown in FIG. 11 (protective tape affixing step).

The above protective tape affixing step is followed by a laser beam application step for forming a groove along the dividing lines 14 on the back surface 10b of the optical device wafer 10. In this laser beam application step, the protective tape 20 side of the optical device wafer 10 is first placed on the chuck table 36 of the laser beam processing machine shown in FIG. 1 and suction held on the chuck table 36. Therefore, the optical device wafer 10 is held in such a manner that the back surface 10b faces up.

The chuck table 36 suction holding the optical device wafer 10 as described above is brought to a position right below the image pick-up means 6 by the processing-feed means 37. After the chuck table 36 is positioned right below the image pick-up means 6, alignment work for detecting the area to be processed of the optical device wafer 10 is carried out by the image pick-up means 6 and the unshown control means. That is, the image pick-up means 6 and the unshown control means carry out image processing such as pattern matching, etc. to align a dividing line 14 formed in a predetermined direction of the optical device wafer 10 with the condenser 53 of the laser beam application means 52 for applying a laser beam along the dividing line 14, thereby performing the alignment to a laser beam application position. The alignment of the laser beam application position is also carried out on dividing lines 14 formed on the optical device wafer 10 in a direction perpendicular to the above predetermined direction. Although the front surface 10a having the dividing lines 14 formed thereon of the optical device wafer 10 faces down at this point, as the image pick-up means 6 comprises an infrared illuminating means, an optical system for capturing the infrared radiation and an image pick-up device (infrared CCD) for outputting an electric signal corresponding to the infrared radiation as described above, images of the dividing lines 14 can be picked up through the back surface 10b.

Figure 12:
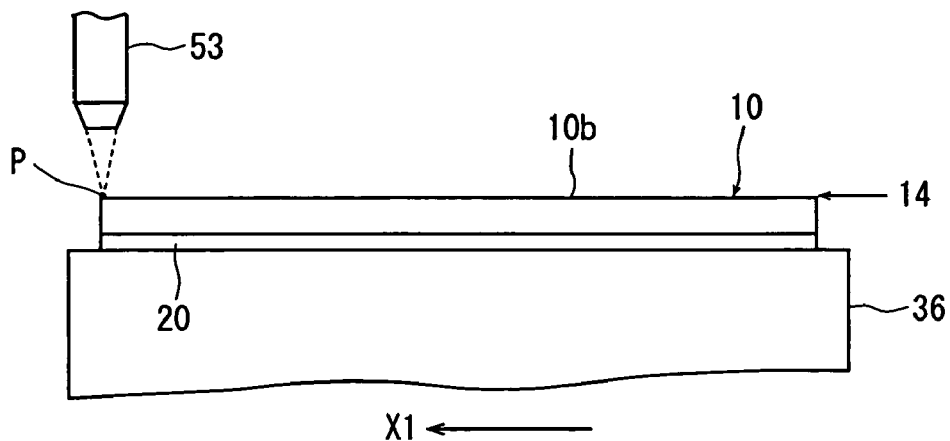
FIGS. 12(a) and 12(b) are explanatory diagrams showing the laser beam application step for forming a groove along a dividing line of the optical device wafer shown in FIG. 9 by the laser beam processing machine shown in FIG. 1.
Figure 12:
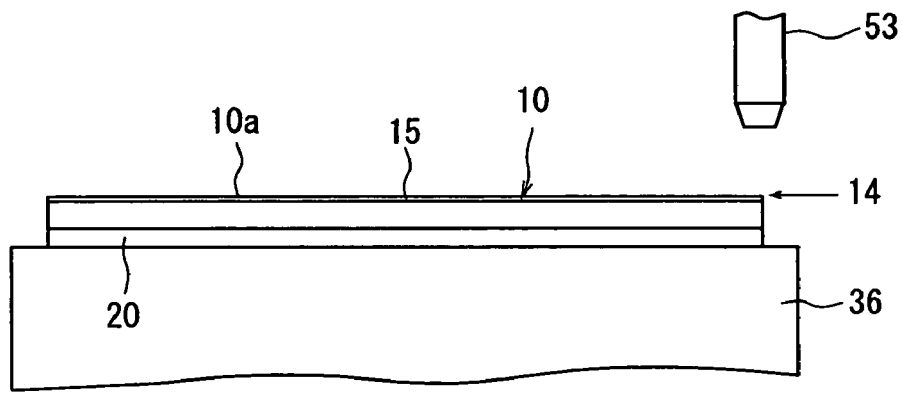

After the alignment of the laser beam application position is carried out by detecting the dividing line 14 formed on the optical device wafer 10 held on the chuck table 36 as described above, the chuck table 36 is moved to a laser beam application area where the condenser 53 of the laser beam application means 52 is located so as to bring the predetermined dividing line 14 to a position right below the condenser 53 as shown in FIG. 12(a). At this point, as shown in FIG. 12(a), the optical device wafer 10 is positioned such that one end (left end in FIG. 12(a)) of the dividing line 14 is located right below the condenser 53. The moving means 54 is activated to adjust the height position of the laser beam application means 52 so that the image forming position "P" of the first laser beam L1 and the second laser beam L2 applied from the condenser 53 is located at the front surface of the dividing line 14.

Figure 13:
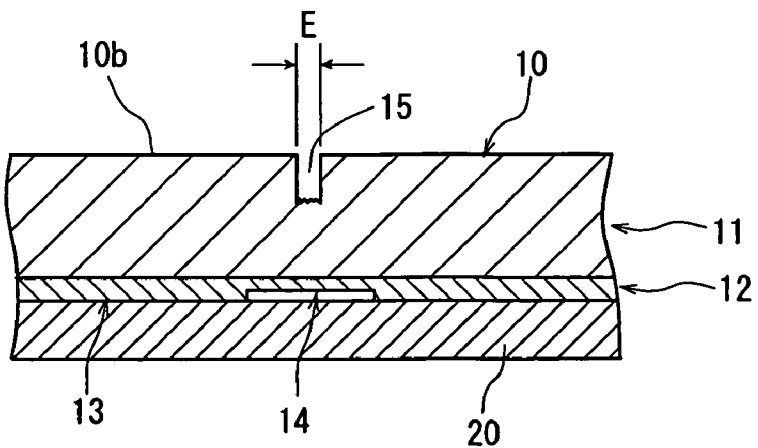
FIG. 13 is an enlarged sectional view of the groove formed in the optical device wafer by carrying out the laser beam application step shown in FIG. 12.

The chuck table 36, that is, the optical device wafer 10 is then moved in the direction indicated by the arrow X1 in FIG. 12(a) at a predetermined feed rate while a laser beam is applied from the condenser 53. When the other end (right end in FIG. 12(b)) of the dividing line 14 reaches a position right below the condenser 53 as shown in FIG. 12(b), the application of the pulse laser beam is suspended, and the movement of the chuck table 36, that is, the optical device wafer 10 is stopped. As a result, a groove 15 having a width (E) is formed along the predetermined dividing line 14 on the back surface 10b of the optical device wafer 10 as shown in FIG. 13. Thus, since the linear portions of the image forming spots of the first laser beam L1 and the second laser beam L2 for forming the groove 15 are located on the outer side and the arcuate portions of the image forming spots are located on the inner side and partially overlapped with each other to form a rectangular spot, a portion having relatively low energy on the outer sides of the Gaussian distribution of the laser beam is located on the inner side and a portion having high energy on the center portion of the Gaussian distribution of the laser beam is located on the outer side. Accordingly, the groove 15 can be formed with the outermost sides of the image forming spots of the first laser beam L1 and the second laser beam L2, whereby the laser beam does not exceed the width (E) of the groove 15. Consequently, the device layer 12 formed on the front surface of the substrate 11 is not damaged by the energy of the laser beam.

The processing conditions in the above laser beam application step are set as follows, for example.

Light source of laser beam: YVO4 laser or YAG laser
Wavelength: 355 nm
Output: 3.0 W
Cyclic frequency: 100 kHz
Pulse width: 10 ns
Feed rate: 30 mm/sec
Width of dividing line: 50 μm
Width (E) of image forming spot: 10 μm After the above laser beam application step is carried out along all the dividing lines 14 formed in the predetermined direction of the optical device wafer 10, the chuck table 36, therefore, the optical device wafer 10 is turned at 90°. The above laser beam application step is carried out along all dividing lines 14 formed on the optical device wafer 10 in a direction perpendicular to the above predetermined direction.

After the above laser beam application step is carried out along all the dividing lines 14 formed on the optical device wafer 10 as described above, the optical device wafer 10 is carried to the subsequent dividing step. In the dividing step, as the grooves 15 formed along the dividing lines 14 of the optical device wafer 10 are so deep that the optical device wafer 10 can be easily divided, the optical device wafer 10 can be easily divided by mechanical breaking.

While an example in which the present invention is applied to an optical device wafer has been described above, the same effect and function are obtained even when the present invention is applied to laser processing along the dividing lines of a semiconductor wafer having a plurality of circuits on the front surface of a substrate.

What is claimed is:

1. A laser beam processing machine comprising a chuck table for holding a workpiece, a laser beam application means for applying a laser beam to the workpiece held on the chuck table, and a processing-feed means for moving the chuck table and the laser beam application means relative to each other, the laser beam application means comprising a laser beam oscillation means and a condenser for converging a laser beam oscillated from the laser beam oscillation means into a converged laser beam to apply the converged laser beam to the workpiece, wherein the condenser comprises a first prism for splitting the laser beam oscillated from the laser beam oscillation means into a first laser beam and a second laser beam each having a semicircular section with an arcuate portion in an inner side and a linear portion in an outer side and for interchanging the first laser beam with the second laser beam, a second prism for correcting optical paths of the first laser beam and the second laser beam split by the first prism to become parallel to each other, and an image forming lens for focusing the first laser beam and the second laser beam whose optical paths have been corrected parallel by the second prism to form on the workpiece a pair of beam spots having linear portions on the outer side and arcuate portions on the inner side; and the image forming lens is configured to direct the first laser beam and the second laser beam to cause said beam spots to partially overlap each other to form a substantially rectangular combined spot in which the inner arcuate portions of the beam spots overlap each other.

2. The laser beam processing machine according to claim 1, wherein the first prism and the second prism have an interval therebetween and the interval is adjustable to change an interval between the spots of the first laser beam and the second laser beam focused by the image forming lens.

3. The laser beam processing machine according to claim 1, further comprising a cylindrical lens arranged on an upstream side of the first prism in a direction of application of the laser beam.

4. The laser beam processing machine according to claim 1, comprising a cylindrical lens arranged on a downstream side of the second prism in a direction of application of the laser beam.

* * * * *